United States Patent
Clauss

(10) Patent No.: US 9,238,590 B2
(45) Date of Patent: Jan. 19, 2016

(54) MIRROR ELEMENTS FOR EUV LITHOGRAPHY AND PRODUCTION METHODS THEREFOR

(71) Applicant: CARL ZEISS SMT GmbH, Oberkochen (DE)

(72) Inventor: Wilfried Clauss, Tuebingen (DE)

(73) Assignee: Carl Zeiss SMT GmbH, Oberkochen (DE)

(*) Notice: Subject to any disclaimer, the term of this patent is extended or adjusted under 35 U.S.C. 154(b) by 134 days.

(21) Appl. No.: 14/204,009

(22) Filed: Mar. 11, 2014

(65) Prior Publication Data

US 2014/0190212 A1 Jul. 10, 2014

Related U.S. Application Data

(63) Continuation of application No. 13/531,315, filed on Jun. 22, 2012, now Pat. No. 8,711,332, which is a continuation of application No. PCT/EP2010/068476, filed on Nov. 30, 2010.

(30) Foreign Application Priority Data

Dec. 22, 2009 (DE) .................. 10 2009 055 119

(51) Int. Cl.
*C03C 23/00* (2006.01)
*C03C 17/00* (2006.01)
(Continued)

(52) U.S. Cl.
CPC ........... *C03C 23/0005* (2013.01); *C03B 32/005* (2013.01); *C03C 17/00* (2013.01);
(Continued)

(58) Field of Classification Search
CPC .. C03B 32/005; C03B 2201/42; C03C 17/00; C03C 17/40; C03C 23/0055; C03C 23/0005; C03C 23/004; C03C 2218/31
See application file for complete search history.

(56) References Cited

U.S. PATENT DOCUMENTS 6,205,818 B1 * 3/2001 Seward, III ........... C03C 21/007
204/157.41
7,352,452 B2 * 4/2008 Wegmann .................. G01J 9/00
356/124
(Continued)

FOREIGN PATENT DOCUMENTS

EP 0483752 A2 5/1992
WO 0108163 A1 2/2001
(Continued)

OTHER PUBLICATIONS

English language translation of Office Action in corresponding German Application No. 102009055119.0, dated Jun. 3, 2014.
(Continued)

*Primary Examiner* — Jason L Lazorcik
(74) *Attorney, Agent, or Firm* — Edell, Shapiro & Finnan, LLC

(57) ABSTRACT

A method for the production of a mirror element (10) that has a reflective coating (10a) for the EUV wavelength range and a substrate (10b). The substrate (10b) is pre-compacted by hot isostatic pressing, and the reflective coating (10a) is applied to the pre-compacted substrate (10b). In the method, either the pre-compacting of the substrate (10b) is performed until a saturation value of the compaction of the substrate (10b) by long-term EUV irradiation is reached, or, for further compaction, the pre-compacted substrate (10b) is irradiated, preferably homogeneously, with ions (16) and/or with electrons in a surface region (15) in which the coating (10a) has been or will be applied. A mirror element (10) for the EUV wavelength range associated with the method has a substrate (10b) pre-compacted by hot isostatic pressing. Such a mirror element (10) is suitable to be provided in an EUV projection exposure system.

16 Claims, 2 Drawing Sheets

(51) Int. Cl.
  *B05D 3/06*  (2006.01)
  *C03B 32/00* (2006.01)
  *C03C 17/40* (2006.01)
  *G02B 1/12*  (2006.01)
  *G02B 5/08*  (2006.01)
  *G02B 7/18*  (2006.01)
  *G03F 7/20*  (2006.01)
  *G21K 1/06*  (2006.01)

(52) U.S. Cl.
  CPC ............... *C03C 17/40* (2013.01); *G02B 1/12* (2013.01); *G02B 5/0891* (2013.01); *G02B 7/181* (2013.01); *G03F 7/7095* (2013.01); *G03F 7/70316* (2013.01); *G21K 1/062* (2013.01); *C03B 2201/42* (2013.01); *C03C 2218/31* (2013.01)

(56) References Cited

U.S. PATENT DOCUMENTS

| | | | | |
|---|---|---|---|---|
| 2003/0226377 A1* | 12/2003 | Barrett | ............... | C03B 19/01 65/17.4 |
| 2008/0149858 A1* | 6/2008 | Weiser | ............... | G02B 1/12 250/492.21 |
| 2012/0026473 A1* | 2/2012 | Genier | ............... | B28Y 10/00 355/18 |
| 2012/0212721 A1* | 8/2012 | Clauss | ............... | G02B 1/12 355/67 |
| 2013/0047669 A1* | 2/2013 | Annamalai | ............ | C03B 19/06 65/17.6 |

FOREIGN PATENT DOCUMENTS

| | | |
|---|---|---|
| WO | 03076352 A2 | 9/2003 |
| WO | 2011020655 A1 | 2/2011 |

OTHER PUBLICATIONS

W. Primak, et al "Radiation Behaviour of Vitreous Silica" Nucl. Sci. Eng., 65, 141, 1978.

R.A.B. Devine "Macroscopic and Microscopic Effects of Radiation in Amorphous SiO2," Nuclear Instruments and Methods in Physics Research B, 91, 1994, pp. 378-390.

Corning, Inc., "ULE Corning Code 7972 Ultra Low Expansion Glass". Aug. 2006.

* cited by examiner

MIRROR ELEMENTS FOR EUV LITHOGRAPHY AND PRODUCTION METHODS THEREFOR

CROSS-REFERENCE TO RELATED APPLICATIONS

This application is a Divisional Application of U.S. application Ser. No. 13/531,315, filed Jun. 22, 2012, which is a Bypass Continuation of PCT/EP2010/068476, which has an International Filing Date of Nov. 30, 2010, and which claims priority under 35 U.S.C. 119(a) to German Patent Application No. 10 2009 055 119.0, filed on Dec. 22, 2009. The entire contents of each of these related applications are hereby incorporated by reference into the disclosure of the present divisional application.

FIELD AND BACKGROUND OF THE INVENTION

The invention relates to production methods for mirror elements and to mirror elements comprising a reflective coating for the EUV wavelength range and a substrate.

It is known that the density of many materials, especially materials containing silicon, changes under irradiation with high-energy radiation. That effect is referred to in the literature as "compaction". For applications in extreme environments (reactors, outer space) in particular, studies were carried out and those effects were quantitatively determined a long time ago (see W. Primak, Nucl. Sci. Eng., 65, 141, 1978: "Radiation Behaviour of Vitreous Silica" and R. A. B. Devine, "Macroscopic and Microscopic Effects of Radiation in Amorphous $SiO_2$", Nuclear Instruments and Methods in Physics Research B 91 (1994), 378-390).

It has been found that the change in volume or density in silicon dioxide typically attains, after sufficiently long irradiation, a saturation value on the order of about 2%-3% within the penetration depth reached by the radiation. The penetration depths of the high-energy types of radiation considered therein were typically in a range of from 0.5 µm to about 10 µm or more.

Comparable effects are also known in microlithography, especially for the VUV wavelength range; however, owing to the relatively low level of interaction of the VUV light with the optical material used, especially quartz glass, the changes in volume in that case are as a rule in the ppm range and therefore, typically, no saturation value is attained, the optical materials used in that case being completely penetrated by the radiation.

A method is known from U.S. Pat. No. 6,205,818 B1 by which quartz glass ($SiO_2$) is to be made insensitive to compacting caused by long-term irradiation with UV laser radiation. The method provides for the quartz glass material to be pre-compacted by being exposed to high-energy radiation or by being pre-treated by hot isostatic pressing (HIP). The high-energy radiation is said to make a compaction of between about 10 ppm and 100 ppm possible, while a change in volume of the entire quartz glass body of from about 0.1% to about 3% is said to be achievable by hot isostatic pressing.

Since microlithography will have to rely in future on the EUV wavelength range in order to obtain a further increase in resolution and since, owing to their coating, the mirrors used in that case are capable of reflecting only about 70% of the incident light and consequently absorb about 30% of the incident light, materials having a low coefficient of thermal expansion are normally used as substrate material for such mirrors. Such so-called "low expansion materials" are, for example, Zerodur®, ULE® or Clearceram®. Those materials normally have an amorphous silicate glass content of above about 50% and, in extreme cases, of even 100%. For a projection exposure system to be capable of functioning on a long-term basis it is necessary to ensure, therefore, that the energy absorbed in the substrate material during operation does not lead to changes in the substrate and thus to degradation of the mirror surface. In other words, it is necessary to ensure that changes of any kind in the shape or roughness of the surface, which can lead to a no longer tolerable increase in aberrations or stray light, do not occur.

OBJECTS AND SUMMARY OF THE INVENTION

An object of the invention to provide production methods for mirror elements so that the mirror elements exhibit no change or only a negligibly small change in surface shape on long-term irradiation with EUV. It is a further object of the invention to provide mirror elements of that kind and an EUV projection exposure system for microlithography having such mirror elements.

In accordance with one aspect, that object is attained by a method for the production of a mirror element that has a reflective coating for the EUV wavelength range and a substrate, the method comprising: pre-compacting the substrate by hot isostatic pressing, and applying the reflective coating to the pre-compacted substrate, wherein either the pre-compacting of the substrate is performed until a saturation value of the compaction of the substrate by long-term EUV irradiation is reached, or, for further compaction, the pre-compacted substrate is irradiated, especially homogeneously, with ions and/or with electrons in a surface region in which the coating has been or will be applied.

In accordance with the invention it is proposed that pre-compacting of a mirror substrate of an EUV mirror be carried out by hot isostatic pressing. The penetration depth of the EUV radiation impinging on the mirror element when in use, and hence the volume of the substrate in which a change in density may occur as a result of EUV irradiation, is admittedly relatively small as a rule (typically some 100 nm). The inventor has found that it is nevertheless advantageous for the entire substrate to be pre-compacted by hot isostatic pressing since such a pressure treatment can be carried out relatively quickly and inexpensively in the case of the materials used as the substrate.

In one variant, there is selected as the substrate material a doped glass material or a glass ceramic, which may be selected in particular from the group comprising: ULE®, Zerodur® and Clearceram®. Such substrate materials have a low coefficient of thermal expansion which may, for example, be at most $|0.5 \times 10^{-7}|$ 1/K in a range of 0° C. to 50° C. To produce such a low coefficient of thermal expansion (CTE), doped glass or glass ceramic materials are typically used—for example, as mentioned above, ULE®, Clearceram® or Zerodur®. Glass ceramic materials having the low coefficient of thermal expansion indicated above consist as a rule of a crystalline phase and a glass phase. The crystalline phase has a negative coefficient of expansion which can precisely be compensated for by the positive coefficient of expansion of the glass phase. Glass materials having a low CTE are as a rule doped glasses, for example $TiO_2$-doped quartz glass (ULE). It will be appreciated that undoped glass, for example undoped quartz glass (fused silica), may alternatively also serve as substrate material. The materials mentioned above have an amorphous silicate glass content of more than about 50 wt. % and are therefore especially suitable for pre-compaction by hot isostatic pressing.

In the hot isostatic pressing, (initial and holding) temperatures of between about 1100° C. and about 1300° C., preferably between 1150° C. and 1250° C., have proved to be especially favourable. It will be appreciated that it is not imperative for a single temperature to be maintained during the hot isostatic pressing; rather, where appropriate, it is possible, for example, for cooling to take place from a maximum temperature in several temperature stages.

In a further variant, the pressure in the hot isostatic pressing is selected to be between 20 MPa and 250 MPa, preferably between 50 MPa and 150 MPa. The use of that pressure range has been found to be especially advantageous for creating a high degree of pre-compaction.

In one variant, the holding time in the hot isostatic pressing is selected to be between 0.5 hour and 5 hours, preferably between 2 hours and 4 hours. It has been found that a sufficient pre-compaction can be achieved even when relatively short holding times are used.

Especially in the case of materials having a high silicate glass content of more than 90 wt. % (such as in the case of ULE®), the hot isostatic pressing may be carried out substantially as described in the above-mentioned U.S. Pat. No. 6,205,818 B1, which regarding that aspect is incorporated into the present application by reference.

The substrate may be compacted by the hot isostatic pressing by at least 1%, preferably by at least 1.5%, and in particular by at least 3%. Especially when the compaction is in the range of about 2%-3% or more, the saturation value of the compaction by long-term EUV irradiation can be reached and therefore the substrate, once pre-compacted, cannot be further compacted by the EUV radiation. It is, however, possible that the saturation value cannot be reached in the hot isostatic pressing or can be reached only with excessively long holding times which may, for example, be in the range of several days.

For that reason, for further compaction the pre-compacted substrate may be irradiated, especially homogeneously, with ions and/or with electrons in a surface region in which the coating has been or will be applied. With this irradiation, a surface region extending from the surface of the substrate over a small depth, typically in the range of several micrometres, can be additionally compacted, so that the saturation value of the density change is reached at least in that region. In this case, the pre-compaction using the inexpensive hot isostatic pressing process permits the irradiation times of the ion or electron irradiation to be considerably reduced and thereby allows any form change possibly occurring as a result of the ion or electron irradiation to be kept as small as possible.

The irradiation is advantageously carried out with high-energy ions having an energy of between 0.2 MeV and 10 MeV at a total particle density of from $10^{14}$ to $10^{16}$ ions per cm$^2$ and/or with high-energy electrons having a dose of between 10 J/mm$^2$ and 2000 J/mm$^2$ at energies of between 10 KeV and 20 KeV. The irradiation may be carried out in this case especially as described in the Applicant's US 61/234815, which is incorporated in this Application by reference. It will be appreciated that, before and/or after the irradiation, additional processing steps, especially smoothing steps at the surface of the substrate, may be carried out, for example as described in the Applicant's US 61/234815.

In one variant, the irradiation is carried out until there is obtained in the surface region a density that is at least 0.5%, preferably at least 1%, in particular at least 1.5% higher than the density of the remainder of the substrate. Together with the change in density obtained on pre-compaction of the substrate it is possible in this case for the saturation value of the compaction to be attained in an especially simple manner. The additionally compacted surface region extends as a rule in this case to a depth of about 5 μm from the surface of the substrate, the exact value depending on the ion or electron energy which is typically so selected that the compacted surface region extends as least as far as the penetration depth of the EUV radiation on use of the mirror.

A further aspect of the invention relates to a mirror element comprising: a reflective coating for the EUV wavelength range, and a substrate, wherein the substrate is pre-compacted by hot isostatic pressing. Either the entire substrate is pre-compacted to a saturation value of the compaction of the substrate by long-term EUV irradiation, or a surface region of the substrate that extends beneath the coating has a density that is at least 0.5%, preferably at least 1%, in particular at least 1.5%, higher than that of the remainder of the substrate. The density of the pre-compacted substrate material markedly exceeds the density of the substrate material attained in a conventional production process (without pre-compaction).

As explained above, the material of the substrate is typically a doped glass material or a glass ceramic having a low coefficient of thermal expansion, especially ULE®, Zerodur® or Clearceram®. Apart from the low thermal expansion of those substrate materials they have the additional advantage that they have a high silicate glass content (about 50 wt. % or more). With that material, a considerable degree of pre-compaction can be achieved by hot isostatic pressing with relatively short holding times.

In one embodiment, the material of the substrate is a quartz glass doped with TiO$_2$, in particular ULE®, an initial density of the substrate before compaction being 2.21 g/cm$^3$. That initial density is typically obtained in ULE® that has been produced by a conventional production process.

Especially when the saturation value of the density change is not yet reached by hot isostatic pressing, the resistance of the substrate to EUV irradiation can be increased if a surface region of the substrate extends beneath the coating, which surface region has a density that is at least 0.5% higher, preferably at least 1% higher, in particular at least 1.5% higher than that of the remainder of the substrate and which surface region has been obtained through high-energy ion or electron irradiation. As described above, it is advantageous if that surface region extends to a depth of about 5 μm from the surface of the substrate. By homogeneous irradiation with ions and/or electrons it is possible to achieve a homogeneous compaction of the substrate in that surface region.

A further aspect of the invention is implemented in an EUV projection exposure system for microlithography, comprising an illumination system and a projection system having at least one mirror element for the EUV wavelength range as described above. In such an EUV projection exposure system, the surface shape of the mirror elements designed as described above changes on EUV irradiation only negligibly during the useful life of the system, and therefore no appreciable surface deformations that might lead to an increase in aberrations or stray light occur any longer.

Further features and advantages of the invention will be apparent from the following description of illustrative embodiments of the invention with reference to the Figures of the drawings, which show details essential to the invention, and from the claims. The individual features may be implemented individually or a plurality thereof may be implemented in any desired combination in a variant of the invention.

BRIEF DESCRIPTION OF THE DRAWINGS

Illustrative embodiments are shown in the schematic drawings and explained in detail in the following description. In the drawings.

DETAILED DESCRIPTION OF PREFERRED EMBODIMENTS

Figure 1:
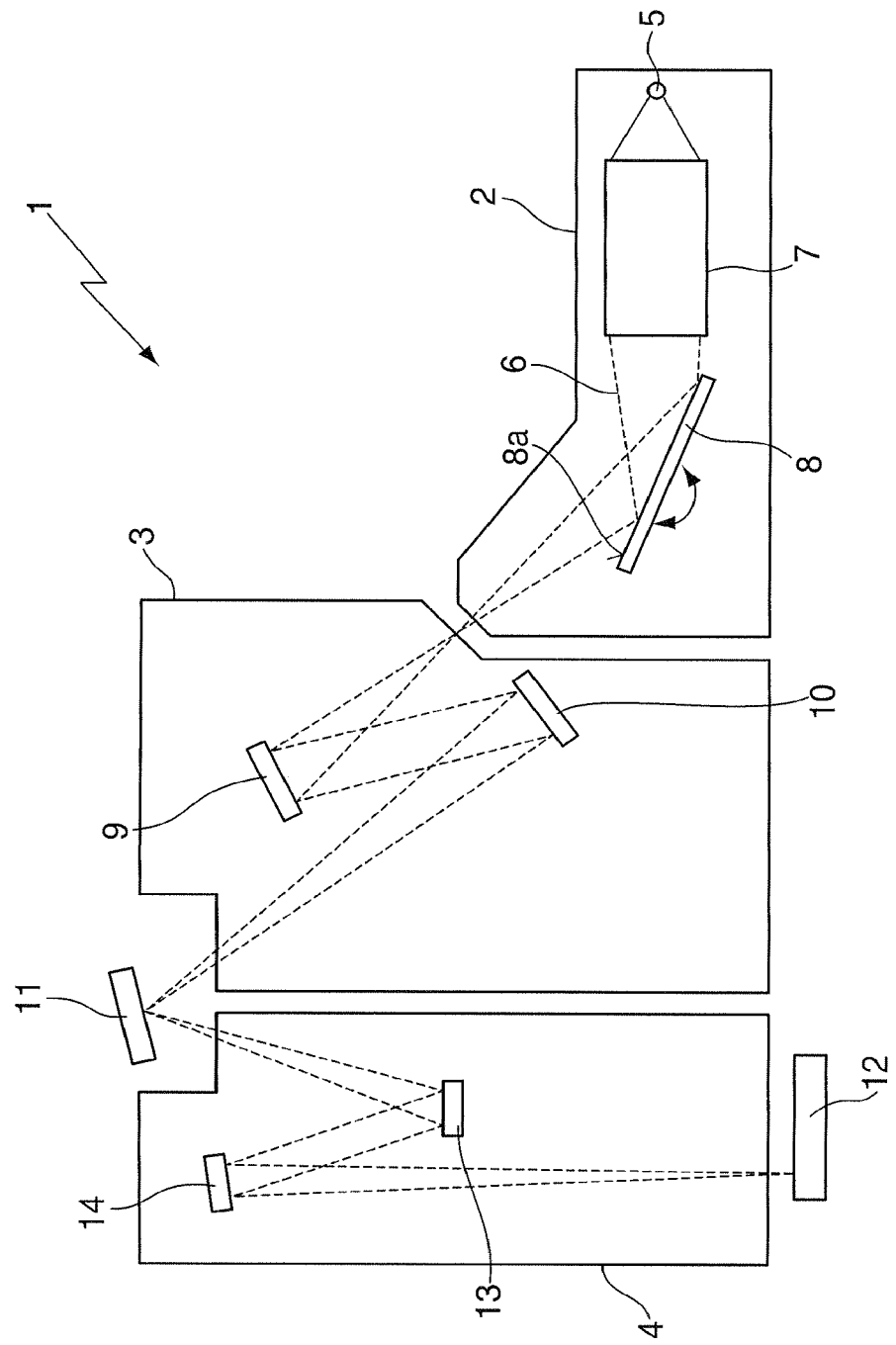
FIG. 1 is a schematic illustration of an embodiment of an EUV lithography system having a plurality of mirror elements.

FIG. 1 shows schematically an EUV projection exposure system 1 comprising a beamshaping system 2, an illumination system 3 and a projection system 4 which are accommodated in separate vacuum housings and are arranged in succession in a beam path 6 from an EUV light source 5 of the beam-shaping system 2. A plasma source or a synchrotron, for example, may be used as the EUV light source 5. The emitted radiation in the wavelength range of between about 5 nm and about 20 nm is first collimated in a collimator 7. Using a downstream monochromator 8, the desired operating wavelength is filtered out by varying the angle of incidence, as indicated by the double-headed arrow. In the wavelength range mentioned, the collimator 7 and the monochromator 8 are usually in the form of reflective optical elements, with at least the monochromator 8 not having a multilayer system on its optical surface in order to reflect a wavelength range as broad as possible.

The radiation treated in the beam-shaping system 2 in respect of wavelength and spatial distribution is introduced into the illumination system 3 which has a first and second mirror element 9, 10. The two mirror elements 9, 10 pass the radiation onto a photomask 11 forming a further mirror element that has a structure which is projected on a reduced scale onto a wafer 12 by the projection system 4. For that purpose, a third and fourth mirror element 13, 14 are provided in the projection system 4. The mirror elements 9 to 14 are in this case disposed in the beam path 6 of the EUV projection exposure system 1 and therefore are exposed to long-term EUV irradiation.

Figure 3:
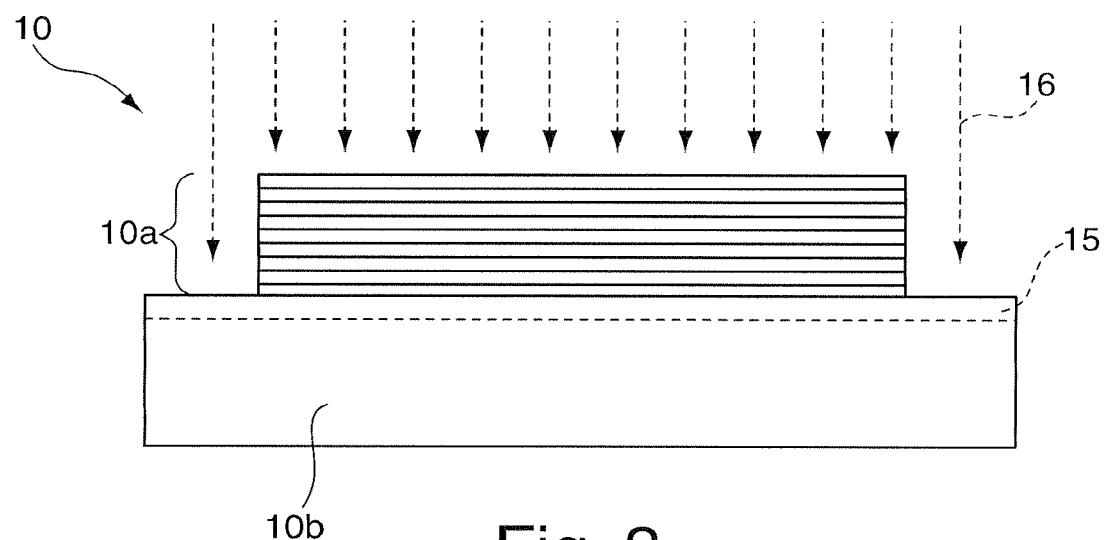
FIG. 3 is an illustration of a mirror element for the EUV projection exposure system of FIG. 1 with the substrate of FIG. 2.

As illustrated in FIG. 3 for the example of the second mirror element 10 of the illumination system 2, that mirror element consists of a reflective coating 10a applied to a substrate 10b. The reflective coating 10a is a multilayer system having alternating layers of molybdenum and silicon whose thicknesses are coordinated in such a manner that as high a reflectivity as possible is obtained at the operating wavelength of the EUV projection exposure system 1 of about 13.5 nm. To avoid deformation on heating of the mirror element 10, the substrate 10b consists of a material having a low coefficient of thermal expansion, typically doped glass or a glass ceramic, for example ULE®, Zerodur® or Clearceram®. Those materials have a silicate content of more than about 50 wt. %, the density of which becomes greater on EUV irradiation of the substrate 10b, in which case the surface of the mirror element 10 may deform, which may lead to aberrations and increased formation of stray light.

Figure 2:
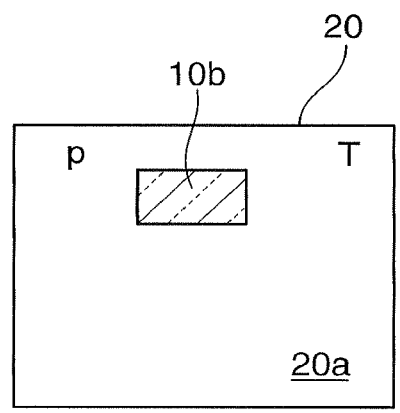
FIG. 2 is a schematic illustration of a pressure chamber for the hot isostatic pressing for pre-compacting a mirror substrate.

To avoid compacting of the substrate 10b on long-term irradiation with the light of the EUV light source 5, a pre-compaction of the substrate 10b is carried out by placing it in a hot isostatic press 20 which is shown in FIG. 2. The press 20 is operated in this case in an inert gas atmosphere 20a, for example with argon being used as the inert gas. In the case under consideration, a sample of the substrate 10a was kept at a temperature T of about 1200° C. and at a pressure p of about 100 MPa for a period of about 4 hours, with both the heating-up and the cooling-down being performed at a rate of about 10 K/min. If, as in the example under consideration, ULE®, i.e. $TiO_2$-doped quartz glass, having a titanium dioxide content of about 8 wt. % is used as the material for the substrate 10b, it can be compacted in the hot isostatic pressing operation using the above-mentioned parameters by about 1.5%-2% relative to its initial density of about 2.21 $g/cm^3$.

To verify the degree of compaction obtained by the hot isostatic pressing, the ULE® sample was subjected to electron irradiation at an energy dose of about $3.7 \times 10^{11}$ rad to simulate long-term EUV irradiation. The form change obtained in that case was about 5 nm, and the degree of compaction, determined by interferometer measurement, was about 0.45%. By comparison, in the case of a non-pre-compacted ULE® sample exposed to electron irradiation at a comparable dose ($4.1 \times 10^{11}$ rad), a degree of compaction of about 1.82% was measured, with the form change being about 20 nm. Using the hot isostatic pressing, therefore, it was possible to achieve a reduction in compaction to a quarter of the value obtained in a sample that had not been pre-treated. In the case of ULE® or comparable materials, the maximum compaction (saturation value) under electron irradiation occurred as a rule above a dose of about 4 to $6 \times 10^{11}$ rad.

In silicon dioxide—and in ULE® glass also—the saturation value of the density change after long-term irradiation with EUV radiation is likewise typically on the order of about 2%-3% within the penetration depth reached by the radiation, which is typically not more than 5 μm. That saturation value may not quite be achieved by pre-compaction of the substrate 10b using the above parameter values.

In order nevertheless to prevent the substrate 10b of the mirror element 10 from becoming further compacted on EUV irradiation, it is homogeneously irradiated with high-energy ions 16 in a surface region 15 in which the coating 10a has been applied. The ions 16 generally have in this case an energy of between about 0.2 MeV and about 10 MeV at a total particle density of from $10^{14}$ to $10^{16}$ ions per $cm^2$. Alternatively, the substrate 10b may also be irradiated with high-energy electrons, the dose typically being in this case between about 10 $J/mm^2$ and 1000 $J/mm^2$.

The irradiation with ions or electrons is carried out in this case until the density in the surface region 15 is at least 0.5%, and where applicable at least 1% or 1.5%, higher than the density of the remainder of the substrate 10b. The surface region 15 typically extends in this case at least as far as the penetration depth of the EUV radiation into the substrate 10b, which in the present case is about 5 μm. By combining the hot isostatic pressing with the irradiation, therefore, it is altogether possible for the saturation value for the density change to be attained at least in the surface region 15, so that even on long-term irradiation with the light of the EUV light source 5 the substrate 10b may experience only extremely slight surface deformation due to the change in density of the substrate 10b.

It will be appreciated that the irradiation with ions and/or electrons may also be performed on the substrate 10b before coating, and that further process steps, especially smoothing of the substrate surface, may be carried out between the hot isostatic pressing and the application of the coating. For details of the irradiation of the substrate with ions or electrons, reference is again made to the Applicant's US 61/234815.

It is again explicitly mentioned that, on suitable selection of the parameters of the hot isostatic pressing, where applicable also exclusively by pre-compaction of the substrate 10b, an increase in density of about 1%-3% can be achieved which, depending on the substrate material used, corresponds to the saturation value of the density change, and therefore the subsequent irradiation with ions or electrons may, where applicable, be dispensed with. In each case, mirror elements whose density remains unchanged under long-term irradiation with EUV radiation are obtained in the manner described above.

The above description of the preferred embodiments has been given by way of example. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

The invention claimed is:

1. A method for producing a mirror element that has a substrate and a reflective coating for extreme ultraviolet wavelength radiation, comprising:
   pre-compacting the substrate by hot isostatic pressing,
   applying the reflective coating to a surface region of the pre-compacted substrate, and further compacting the pre-compacted substrate by irradiating the pre-compacted substrate with at least one of ions and electrons in a surface region of the substrate,
   wherein the pre-compacted substrate is irradiated until a density in the surface region is at least 0.5% higher than a density of a remainder of the substrate that is not in the irradiated region.

2. The method according to claim 1, wherein the pre-compacted substrate is irradiated homogeneously before the coating is applied in the surface region.

3. The method according to claim 1, wherein the coating is applied before the pre-compacted substrate is irradiated homogeneously.

4. The method according to claim 1, further comprising selecting a doped glass material or a glass ceramic as the material for the substrate.

5. The method according to claim 1, wherein the temperature during the hot isostatic pressing is selected to be between 1100° C. and 1300° C.

6. The method according to claim 5, wherein the temperature during the hot isostatic pressing is selected to be between 1150° C. and 1250° C.

7. The method according to claim 1, wherein the pressure during the hot isostatic pressing is selected to be between 20 MPa and 250 MPa.

8. The method according to claim 7, wherein the pressure during the hot isostatic pressing is selected to be between 50 MPa and 150 MPa.

9. The method according to claim 1, wherein the holding time during the hot isostatic pressing is selected to be between 0.5 hour and 5 hours.

10. The method according to claim 9, wherein the holding time during the hot isostatic pressing is selected to be between 2 hours and 4 hours.

11. The method according to claim 1, wherein the substrate is compacted by the hot isostatic pressing by at least 1%, preferably by at least 1.5%, in particular by at least 3%.

12. The method according to claim 11, wherein the substrate is compacted by the hot isostatic pressing by at least 3%.

13. The method according to claim 1, wherein at least one of:
   (a) the ions have an energy of between 0.2 MeV and 10 MeV at a total particle density of from $10^{14}$ to $10^{16}$ ions per cm$^2$, and
   (b) the electrons have a dose of between 10 J/mm$^2$ and 1000 J/mm$^2$ at energies of between 10 KeV and 20 KeV.

14. The method according to claim 1, further comprising: carrying out the irradiation until there is obtained in the surface region a density that is at least 1% higher than the density of the remainder of the substrate.

15. The method according to claim 14, wherein the irradiation is carried out until there is obtained in the surface region a density that is at least 1.5% higher than the density of the remainder of the substrate.

16. The method according to claim 14, wherein the surface region extends to a depth of 5 μm from the surface of the substrate.

* * * * *